United States Patent [19]

Kage

[11] 4,204,164

[45] May 20, 1980

[54] NOISE DETECTOR CIRCUIT

[75] Inventor: Kouzou Kage, Tokyo, Japan

[73] Assignee: Nippon Electric Co., Ltd., Tokyo, Japan

[21] Appl. No.: 930,837

[22] Filed: Aug. 3, 1978

[30] Foreign Application Priority Data

Aug. 8, 1977 [JP] Japan .................................. 52-94144

[51] Int. Cl.$^2$ .............................................. H04B 1/10
[52] U.S. Cl. .................................. 455/135; 179/1 P; 455/226
[58] Field of Search ............... 325/304, 348, 402, 403, 325/404, 473; 179/1 P

[56] References Cited

U.S. PATENT DOCUMENTS

| | | | |
|---|---|---|---|
| 3,544,900 | 12/1970 | Beyer | 325/473 |
| 3,961,275 | 6/1976 | Kochsmeier | 325/473 |
| 4,630,040 | 6/1977 | Harbert | 325/304 |

Primary Examiner—David L. Stewart
Attorney, Agent, or Firm—Sughrue, Rothwell, Mion, Zinn and Macpeak

[57] ABSTRACT

A noise detector circuit for radio receivers is disclosed. The circuit includes a delay circuit for slightly delaying a received signal. A comparator compares the level of the received signal with the delayed signal to generate a pulse sequence having a number of pulses per unit that is proportional to the level of said noise. A counter counts the number of pulses to detect the level of the noise in the received signal.

8 Claims, 5 Drawing Figures

NOISE DETECTOR CIRCUIT

BACKGROUND OF THE INVENTION

The present invention relates to a noise detector circuit for detecting noise contained in a received signal.

Noise detector circuits are used as a control circuit for squelching a receiver or for selecting a receiver of highest S/N ratio in a diversity receiving system. They also find application in the electric field intensity measurement.

A conventional noise detector circuit is generally composed of a high-pass filter for deriving noise from a received signal, a rectifier (containing a diode) for rectifying the output of the filter, an integrator (consisting of a resistor R and a capacitor C) for integrating the output of the rectifier, and a comparator either for comparing the output of the integrator with a given reference detection level or for converting the output signal into a digital signal and then comparing the digital signal with a given reference digital signal, to provide a detection signal.

However, such a noise detector circuit has the following disadvantages:

(a) Since the noise detector circuit is generally composed of analog circuits, it is sensitive to variations of various circuit constants. Particularly, the forward voltage characteristic of the diode in the rectifier is affected directly by the change in temperature, deteriorating accuracy of the noise detection.

(b) A high-pass filter for deriving noise is required.

(c) The integrator having an inherent time constant slows down the noise detection.

(d) Since the characteristics of the high-pass filters and rectifiers employed in the noise detector circuits are different from one detector circuit to another, delicate adjustment is needed in respective noise detector circuits to make the overall noise detection level uniform. In addition, the reference detection level is apt to be changed by the variation in the power source voltage.

(e) Where a digital comparator is used, an A/D converter must be used to convert the analog output signal of the integrator into a digital signal.

For further details of the prior art techniques relating to the above-described noise detector circuits, reference is made to the following published literatures:

(1) U.S. Pat. No. 3,783,384 (issued Jan. 1, 1974);

(2) U.S. Pat. No. 3,613,004 (issued Oct. 12, 1971);

(3) T. Nagatsu, et al "Base Station Radio Equipment for 800 MHz Band Land Mobile Telephone System", *Review of the Electrical Communication Laboratories*, Vol. 25 No. 11–12, pp. 1245 to 1254, 1977;

(4) William G. Figel, et al "Vehicle Location by a Signal Attenuation Method", *IEEE Transactions on Vehicular Technology*, Vol. VT-18, No. 3, pp. 105–109, November 1969; and (5) T. Nagatsu "Vehicle Locating by Field Detection in the Small-Cell Land Mobile System", *Review of the Electrical Communication Laboratories*, Vol. 21, No. 11–12, pp. 830 to 842, 1973.

SUMMARY OF THE INVENTION

It is one object of the present invention to provide an improved noise detector circuit that is free from the aforementioned shortcomings in the prior art.

According to the present invention, there is provided a noise detector circuit comprising a delay circuit for slightly delaying a received signal containing noise, a comparator for comparing the received signal level with the output level of the delay circuit to generate a pulse sequence having a number of pulses per unit time that is proportional to the noise level, and a counter for counting the number of the output pulses of the comparator to detect the noise.

BRIEF DESCRIPTION OF THE DRAWINGS

Now the present invention will be described in greater detail with reference to the accompanying drawings, in which.

DETAILED DESCRIPTION OF THE INVENTION

Figure 1:
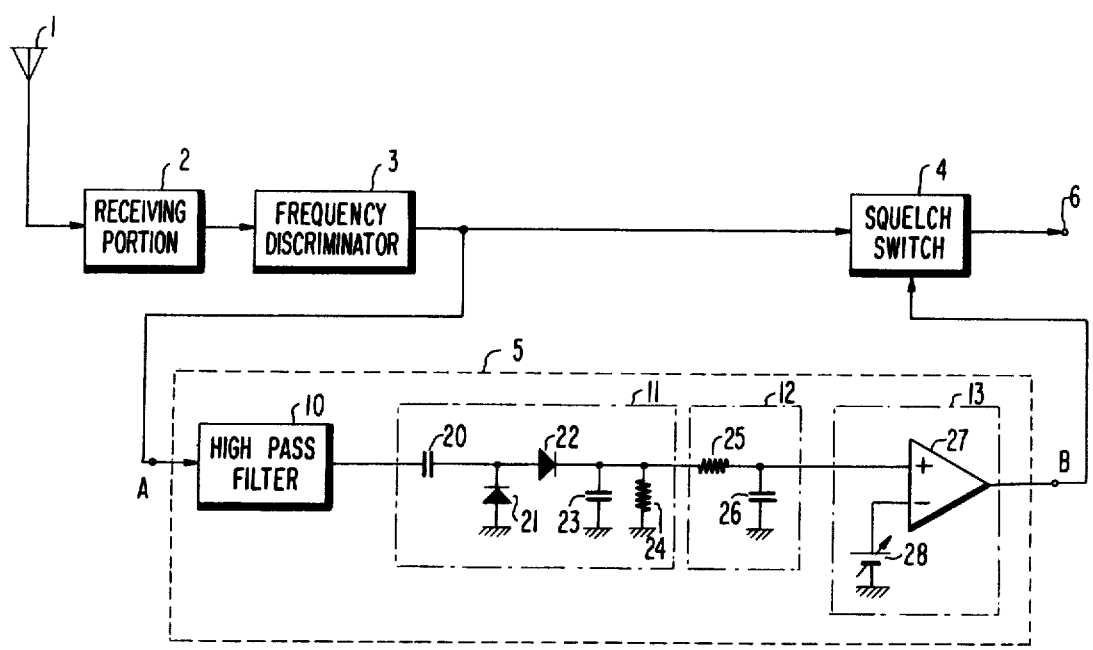
FIG. 1 is a block diagram of one example of a receiver for frequency-modulated waves provided with a noise detector circuit in the prior art.

With reference to FIG. 1, a frequency-modulated wave (for instance, FM or FSK) is received by a receiving portion 2 through an antenna 1. An output of the receiving portion 2 is demodulated into a baseband signal by a frequency discriminator 3. If a noise detector circuit 5 detects that noise at the output of the frequency discriminator 3 exceeds a predetermined level, then it switches off a squelch switch 4 so that the demodulated signal may not be fed to an output terminal 6.

The noise detector circuit 5 is composed of a high-pass filter 10, a rectifier 11, an integrator 12 and an amplitude comparator 13. In addition, the rectifier 11 comprises capacitors 20 and 23, diodes 21 and 22 and a resistor 24. The integrator 12 comprises a resistor 25 and a capacitor 26. The amplitude comparator 13 comprises a differential amplifier 27 and a reference detection voltage source 28. In this noise detector circuit 5, the noise contained in the demodulated signal is extracted by a high-pass filter 10. After the extracted noise signal has been recitifed by the rectifier 11, it is integrated by the integator 12 to prevent a quick response with respect to the time constant determined by the resistor 25 and the capacitor 26. The output of the integrator 12 is compared with the reference voltage of the voltage source 28. If the noise level is higher than the reference voltage, then the squelch switch 4 is switched off.

It is to be noted that when the analog noise level at the output of the integrator 12 is digitized and then detected, then in place of the amplitude comparator 13 it is only necessary to provide a circuit in which the output of the integrator 12 is converted into a digital signal and the converted digital signal is compared with a reference digital signal. Furthermore, when the above-described receiver is used in a diversity receiving system, a computer is used to process a plurality of noise informations and control the system. In this case, the noise level signals at the respective receivers must be converted into binary digital signals through A/D converters.

Figure 2:
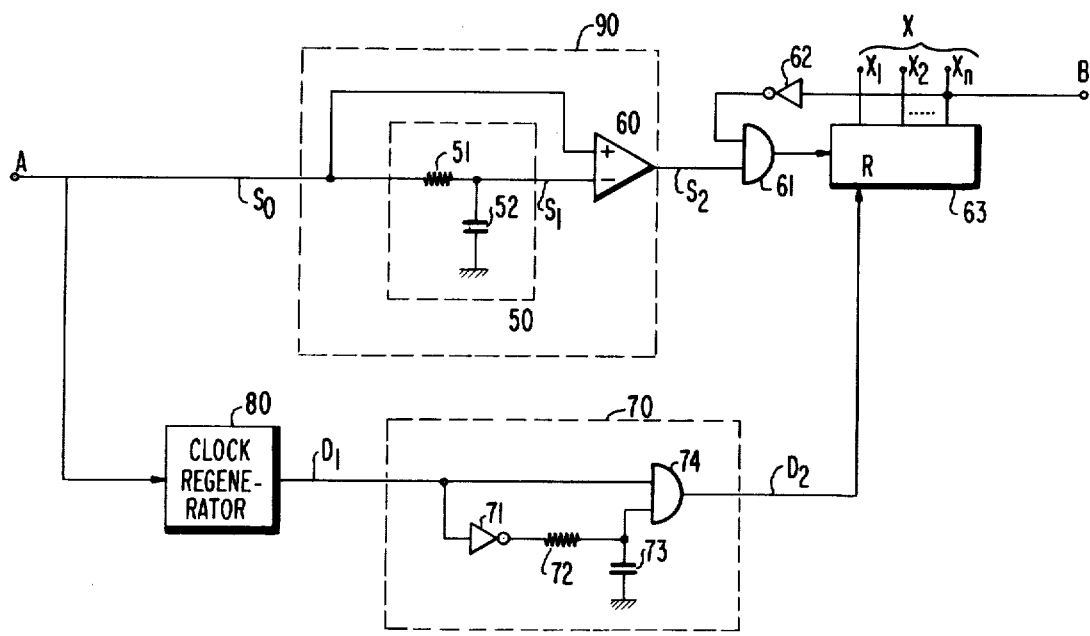
FIG. 2 is a block diagram of one preferred embodiment of the present invention.

A noise detector circuit according to the present invention is illustrated in FIG. 2. This noise detector circuit can be connected, for instance, between points A and B in FIG. 1.

In FIG. 2, a demodulated signal is slightly delayed (by a period $\tau_1$, in FIGS. 3 and 4) in a delay circuit 50 (consisting of a resistor 51 and a capacitor 52). Input $S_O$ and an output $S_1$ of the delay circuit 50 are compared by a comparator 60 to output a pulse sequence $S_2$ having a number of pulses per unit time that is proportional to the noise level. The output $S_2$ of the comparator 60 is fed to an n-stage counter 63 through a gate circuit 61. When the count at the counter 63 reaches a given value, for example, when the last stage output Xn of the counter rises, the gate circuit 61 is closed by the output Xn through an inverter 62, to prevent the count in the counter 63 from overflowing. When the frequency band of the received signal $S_O$ is limited and there is no concern that the count in the counter 63 overflows, then the gate circuit 61 and invertor 62 are not needed. Instead it is only necessary that the output of the comparator 60 is in itself counted and any one of the outputs $X_1 \ldots X_n$ corresponding to a present value is connected to a terminal B. A clock regenerator 80 regenerates a clock $D_1$ from the received signal. In a reset pulse generator 70, a reset pulse $D_2$ having a narrow width is generated at the leading edge of the clock pulse $D_1$ to reset the counter 63. This reset pulse generator 70 comprises an inverter 71, a resistor 72, a capacitor 73 and an AND gate 74. The output of the inverter 71 is delayed by the resistor 72 and capacitor 73.

Figure 4:
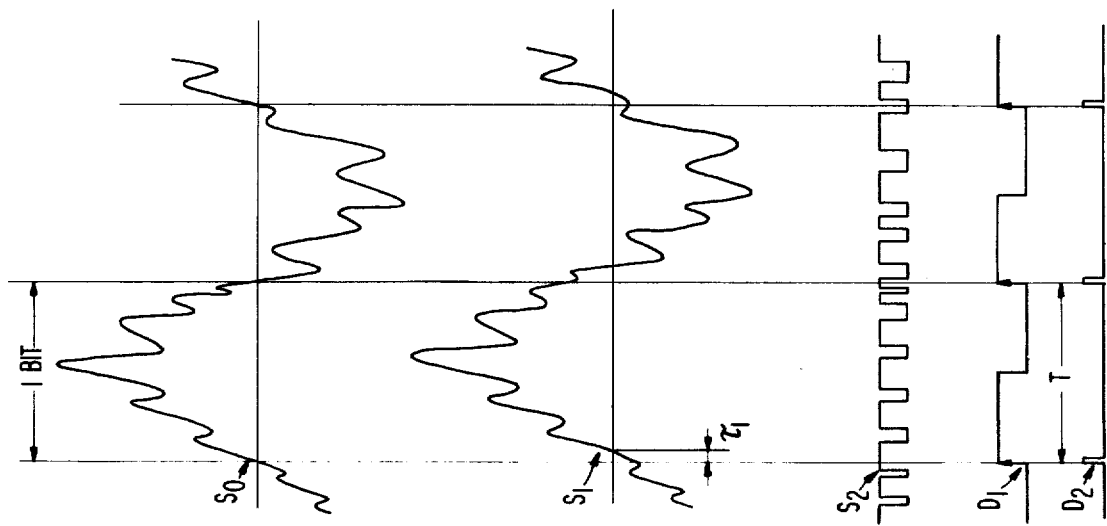
FIGS. 3 and 4 are time charts for explaining the operation of the embodiment shown in FIG. 2.
Figure 3:
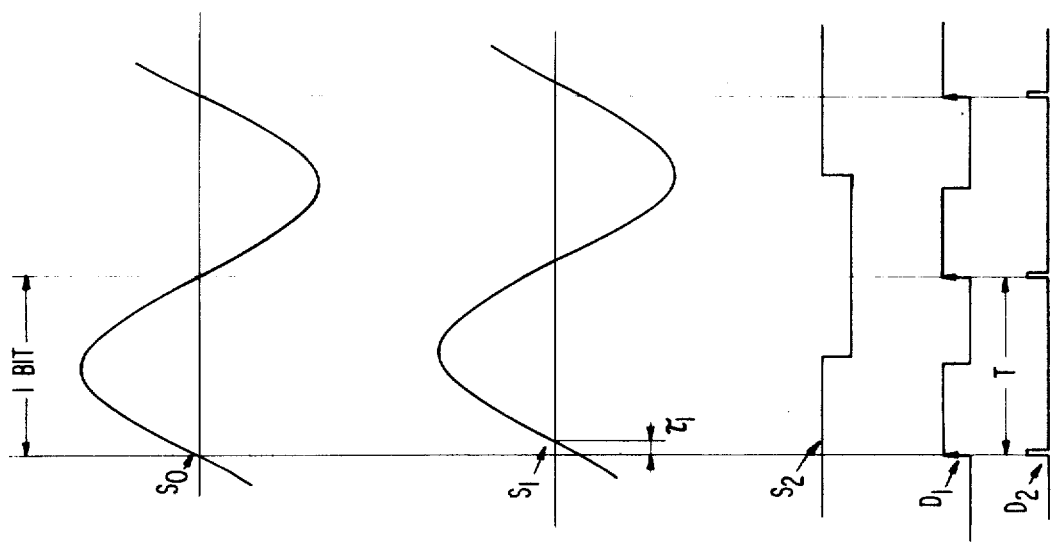

FIGS. 3 and 4 are waveform diagrams showing the waveforms at various points in FIG. 2 when the noise is detected for each bit period. FIG. 3 shows waveforms when the received electric field is strong and the noise level is low. Then since little noise is contained in the signal $S_O$, there are a few cross-over points between the signal waveforms $S_O$ and $S_1$. As a result, the pulse waveform $S_2$ which rises and falls at these cross-over points has only a few transient points. Accordingly, the number of pulses counted by the counter 63 within one clock period of detection pulses $D_1$ is very small.

Whereas, FIG. 4 shows waveforms when the received electric field is weak and the received signal $S_O$ contains a considerable amount of noise. Then, in the comparator output $S_2$ which is obtained by comparing the received signal $S_O$ with the delayed output $S_1$, there occurs many transient points in proportion to the noise level. Accordingly, measurement of the noise can be achieved by counting the pulses in the pulse sequence $S_2$ and feeding a detection pulse to the terminal B when the count has exceeded a preset value, or by merely counting the pulses in the pulse sequence $S_2$.

Delay circuits consisting of a resistor and a capacitor were used for the delay circuits 50 and 72-73 in the above-described embodiment illustrated in FIG. 2. However, analog delay elements such as BBD's (Bucket Brigade Circuits) or CCD's (Charge Coupled Devices) or other circuits may be used in place of the illustrated delay circuits.

Also, the counter 63 is reset at clock periods by means of reset pulses regenerated from the received signal. However, an independent timing pulse generator (such as, for example, the circuit 300 in FIG. 5 to be described later) may be provided to reset the counter 63 at any arbitrary periods.

In addition, for details of the clock regenerator 80, reference is made to the following literature:

(6) Floyd M. Gardner, *Phaselock Techniques*, Wiley & Sons, Inc., pp. 117 to 119, 1966.

Figure 5:
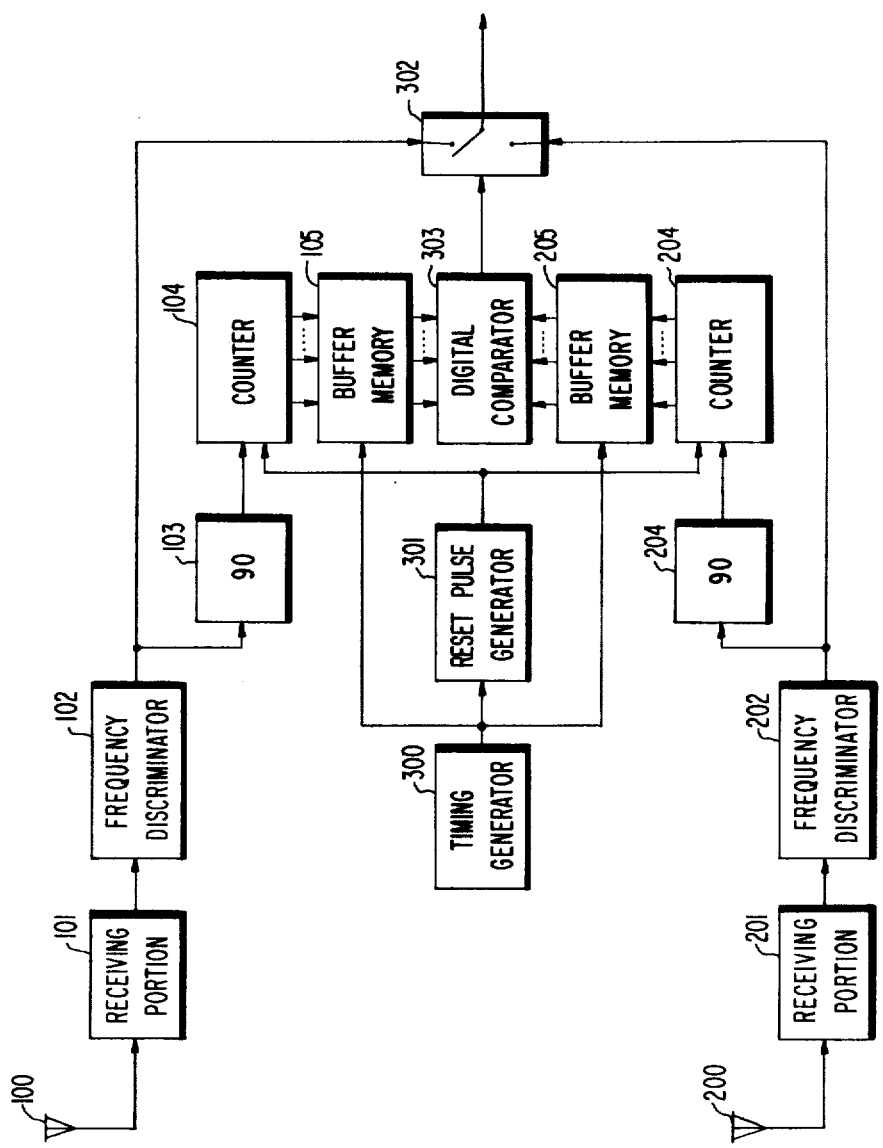
FIG. 5 is a block diagram of the noise detector circuit of the present invention as used in a diversity receiver apparatus.

In a diversity reception system illustrated in FIG. 5, the same modulated wave is received by receiving portions 101 and 201, respectively, through antennae 100 and 200. These received signals are respectively demodulated by frequency discriminators 102 and 202. The demodulated signals are respectively applied to circuits 103 and 203 (equivalent to the circuit 90 in FIG. 2), and also fed to a switch 302.

The output pulse sequences from the circuits 103 and 203 are counted by counters 104 and 204 (equivalent to the counter 11 in FIG. 2), respectively. The counts held in these counters indicate the levels of the noise contained in the respective demodulated signals. The counts in these counters 104 and 204 are read into buffer memories 105 and 205, respectively, as controlled by a detection pulse fed from a timing pulse generator 300. The numerical values in these buffer memories 105 and 205 are compared in magnitude with each other by means of a digital comparator (for instance, CD4063B manufactured and put on sale by RCA can be used as a 4-bit capacitor). The switch 302 is controlled by the output of the comparator 303 so that the received signal containing less noise may be selected and outputted. The counters 104 and 204 are reset by a reset pulse fed from a reset pulse generator 301 (equivalent to the circuit 70 in FIG. 2).

It is to be noted that a clock regenerator as illustrated in FIG. 2 may be used in place of the timing pulse generator 300. In addition, the timing pulse generator 300 and the reset pulse generator 301 may be constructed integrally.

As described above, in the noise detector circuit according to the present invention, the noise level can be detected and measured regardless of the leve of the received signal $S_O$. Accordingly, the adjustment of the signal level as carried out in the prior art examples is unnecessary. In addition, the count in the counter 63 is the quantitative information directly representing the noise level, so that an analog-to-digital converter as used in the conventional noise detector circuit is not needed. Accordingly, the circuit can be constructed at a low cost. Furthermore, since the counter 63 is cleared every time noise has been detected, the signal voltage, which has undergone the noise detection, cannot remain unchanged as is the case with the rectifier 11 and the integrator 12 of the conventional noise detector circuit. Thus, the detection and measurement of noise at a relatively high speed is possible. Still further, since a few analog elements are included in the overall circuit, the present noise detector circuit is stable against the variations of the respective circuit elements.

What is claimed is:

1. A noise detector circuit for a radio receiver, comprising:
   a delay circuit for slightly delaying a received signal containing noise,
   a comparator for comparing the level of said received signal with the output level of said delay circuit to generate a pulse sequence having a number of pulses per unit time that is proportional to the level of said noise, and
   a counter for counting the number of the output pulses of said comparator to detect the level of said noise.

2. A noise detector circuit as claimed in claim 1, further comprising a gate circuit provided between said comparator and said counter for controlling the output pulses of said comparator in response to the output of said counter and for supplying the controlled output pulses to the input of said counter.

3. A noise detector circuit as claimed in claim 1, further comprising a switch connected to the output of said radio receiver and responsive to the output of said counter for controlling transmission of said received signal therethrough.

4. A noise detector circuit as claimed in claim 1, further comprising:
   a clock regenerator for regenerating a clock pulse from said received signal, and
   a reset pulse generator responsive to said clock pulse for generating pulses having a narrow pulse width to reset said counter.

5. A noise detector circuit as claimed in claim 4, further comprising means responsive to the output of said clock regenerator for storing the count in said counter.

6. A noise detector circuit as claimed in claim 1, further comprising means for generating pulses to be used for resetting said counter.

7. A noise detector circuit for a diversity radio receiver, comprising:

first and second delay circuits for slightly delaying first and second received signals, respectively, containing first and second noises, respectively;

first and second comparators for comparing the levels of said first and second received signals with the output levels of said first and second delay circuits, respectively, to generate first and second pulse sequences, respectively, having numbers of pulses per unit time which are proportional to the levels of said first and second noises, respectively;

first and second counters for counting the numbers of the output pulses of said first and second comparators, respectively, to detect the levels of said first and second noises, respectively;

first and second memories for storing the counts in said first and second counters, respectively;

first means for generating reset pulses to be used for resetting said first and second counters; and a third comparator for comparing the numerical values stored in said first and second memories with each other to detect which of said first and second noises has a higher level than the other.

8. A noise detector circuit as claimed in claim 7, further comprising second means responsive to the output of said third comparator for selecting either one of said first and second received signals.

* * * * *